United States Patent [19]
Lee et al.

[11] Patent Number: 6,058,495
[45] Date of Patent: May 2, 2000

[54] MULTI-BIT TEST CIRCUIT IN SEMICONDUCTOR MEMORY DEVICE AND METHOD THEREOF

[75] Inventors: Hi-Choon Lee; Jae-Hyeong Lee, both of Seoul, Rep. of Korea

[73] Assignee: Samsung Electronics, Co. Ltd., Suwon, Rep. of Korea

[21] Appl. No.: 08/854,300

[22] Filed: May 12, 1997

[30] Foreign Application Priority Data

May 16, 1996 [KR] Rep. of Korea .................. 96-16885

[51] Int. Cl.[7] ................ G11C 29/00; G11C 7/00
[52] U.S. Cl. .......................... 714/718; 365/201
[58] Field of Search .................... 714/718, 819, 714/735, 736, 737; 365/201

[56] References Cited

U.S. PATENT DOCUMENTS

| | | |
|---|---|---|
| 4,622,653 | 11/1986 | McElroy ......................... 365/49 |
| 4,744,061 | 5/1988 | Takemae et al. ................ 365/201 |
| 5,075,892 | 12/1991 | Choy ............................. 371/68.1 |
| 5,228,000 | 7/1993 | Yamagata ...................... 365/201 |
| 5,587,950 | 12/1996 | Sawada et al. ................ 365/201 |

*Primary Examiner*—Hoa T. Nguyen
*Attorney, Agent, or Firm*—Marger Johnson & McCollom, P.C.

[57] ABSTRACT

A multi-bit test circuit detects the fail cells in a memory block accurately even though there exists a short bridge between bit lines or between memory cells. The circuit includes an input buffer for transferring a same test data bit received from a multi-bit input/output pin to selected ones of the memory cells in each block in response to a multi-bit test enable signal, a plurality of sense amplifier drivers connected to the respective memory cells, for amplifying the test data bits to transfer the amplified data bits to the associated memory cells, and reading out the test data bits stored into the associated memory cells, and a comparator for comparing the same data bits stored into the same block to generate a comparison data bit in response to the multi-bit input/output enable signal, and transferring the comparison data to the multi-bit input/output pin.

15 Claims, 2 Drawing Sheets

MULTI-BIT TEST CIRCUIT IN SEMICONDUCTOR MEMORY DEVICE AND METHOD THEREOF

BACKGROUND OF THE INVENTION

1. Field of the Invention

The present invention relates to a semiconductor memory device, and more particularly a semiconductor memory device including a multi-bit test circuit and a method thereof.

2. Description of the Related Art

In general, a semiconductor memory device, for example, a high density dynamic RAM (Random Access Memory) includes a multi-bit test circuit. Further, it is well known that four input/output pins (though not necessarily) are commonly used in a multi-bit test mode, while eight input/output pins are used in a normal read/write mode. The number of the input/output pins used in the multi-bit test mode should be as small as possible, in order to simultaneously obtain fail information of a plurality of memory cells. In other words, with use of the four input/output pins, sixteen memory cells are accessible simultaneously to write test data bits therein. Then, the written test data bits in the same block are read out and compared to one another to generate a comparison data. The comparison data is transferred to the associated input/output pin. As a result, it is possible to check the fail bits of more memory cells, with use of the less input/output pins. As described in the foregoing, the multi-bit test is able to detect fail bits of more memory cells within a limited short time. Thus, it is possible to quickly test the performance of a dynamic RAM at a low cost. Such multi-bit test circuit is disclosed in U.S. Pat. No. 5,029,330 entitled "Semiconductor Memory Device", issued to Kajigaya et. al. on Jul. 2, 1991.

FIG. 1, discloses a prior art multi-bit test circuit. For the convenience of explanation, the input/output pins used in the multi-bit test mode of operation will be referred to as multi-bit input/output pins. Commonly, one or more multi-bit input/output pins are used for the multi-bit test. Further, the multi-bit test can be performed on a device in a package state or a wafer state. In the following descriptions, the multi-bit test is performed in a wafer state with use of four multi-bit input/output pins, in order to secure the more effective multi-bit test.

As illustrated in FIG. 1, a memory cell array is divided into sub-arrays 100 and 101. The sub-array 100 is again divided into blocks BLK0 and BLK1, and the sub-array 101 into BLK2 and BLK3. The blocks BLK0-BLK3 include memory cells C1–C4, C5–C8, C9–C12, and C13–C16, respectively, which are connected to intersections of bit lines BL1–BL4 and word lines WL0–WL3. Moreover, redundant word lines RWL0–RWL3 for replacing fail word lines are arranged in the vicinity of the blocks BLK0–LK3, respectively. The bit lines BL1–BL4 are connected to one end of sense amplifier drivers 103–110, respectively. The sense amplifier drivers 103–110 transfer data on multi-bit input/output pins TIO0, TIO2, TIO4, and TIO6 to the memory cells via the bit lines BL1–BL4, and/or read out the data stored into the memory cells. The other ends of the sense amplifier drivers 103–110 are connected to outputs from input buffers 115–118, respectively. The input buffers 115–118 transfer the data on the multi-bit input/output pins TIO0, TIO2, TIO4, and TIO6 to the sense amplifier drivers 103–110, in response to a multi-bit test enable signal MBTE. The other ends of the sense amplifier drivers 103–110 are also connected to comparators 111–114, respectively. The comparators 111–114 compare and compress the amplified signal outputs from the sense amplifier drivers 103–110 in response to the multi-bit test enable signal MBTE, and transfer the comparison data to the multi-bit input/output pins TIO0, TIO2, TIO4, and TIO6, respectively. In the light of the comparison data output from the comparators 111–114, the multi-bit test circuit detects a block including the fail memory cell. As described above, the multi-bit test operation is performed by means of a plurality of sub-arrays, sense amplifiers, input buffers, comparators, and input/output pins.

In the normal mode of operation, eight input/output pins IO0–IO7 are used for reading/writing data. Binary data (or data bits) received from the input/output pins IO0–IO7 are written into the memory cells C1–C16. Then, the written data are read out through the input/output pins IO0–IO7 by means of the above described circuits. Meanwhile, in the multi-bit test mode of operation, the same test data bit is simultaneously written into the four memory cells in each block via the associated multi-bit input/output pin. Then, the test data bits written into the memory cells in the same block are read out and compared to one another to check whether or not they are identical. Therefore, only four or less than four multi-bit input/output pins, which are less than the number of input/output pins used in the normal read/write mode, are used in the multi-bit test mode.

Meanwhile, the comparators 111–114 connected to the sense amplifier drivers 103–110 compare the test data bits stored into the memory cells in the same blocks in response to the multi-bit test enable signal MBTE, to generate flag data "1" or "0" at the multi-bit input/output pins. Based on the flag data appearing at the multi-bit input/output pins, it is possible to check whether or not the blocks include the fail memory cells, and to obtain positional information about the fail bits. For example, in the case where the flag data "0" is generated from the comparator 111 to the multi-bit input/output pin TIO0, the scheme recognizes that at least one of the memory cells C5–C8 connected to the word line WL1 in the block BLK1 is the fail cell, and replaces the fail word line WL1 with the redundant word line RWL1. However, as described above, the prior art multi-bit test circuit writes the same test data bits into all the memory cells connected to the same word line. For example, the same test data bit on the multi-bit input/output pins TIO0 is written into the memory cells C5–C8 in the block BLK1. Therefore, in the case where the memory cell C5 cannot store the test data bit due to the fail, the comparator 111 can misrecognize the output data of the memory cell C5 as having the same phase as that of the memory cell C6, if a short bridge exists between the bit lines BL1 and BL2. In this case, the fail of the memory cell C5 cannot be detected. In the end, such prior art multi-bit test circuit has a problem that the fail cell might not be accurately detected when there exists the short bridge between the bit lines.

SUMMARY OF THE INVENTION

It is therefore an object of the present invention to provide a multi-bit test circuit and method capable of detecting the fail cells accurately even though there exists a short bridge between bit lines.

It is another object of the present invention to provide a fast multi-bit test circuit and method for accurately detecting the fail cells and positional information of the fail bits.

According to one aspect of the present invention, a multi-bit test method for testing a plurality of memory cells includes the steps of activating a plurality of blocks each including the memory cells connected to bit lines and word lines; storing a same data bit into selected ones of the memory cells in the respective blocks via a multi-bit input/output pin, the memory cells contiguous to one another in the same block storing complementary data bits; and comparing the same data bits stored into the same block to generate fail bit information at the multi-bit input/output pin.

According to another aspect of the present invention, a multi-bit test circuit for testing a plurality of memory cells to generate fail information of a plurality of blocks each including the memory cells connected to bit lines and word lines, includes an input buffer for transferring a same test data bit received from a multi-bit input/output pin to selected ones of the memory cells in each block in response to a multi-bit test enable signal. A plurality of sense amplifier drivers are connected to the respective memory cells, for amplifying the test data bits to transfer the amplified data bits to the associated memory cells, and reading out the test data bits stored into the associated memory cells. A comparator for comparing the same data bits stored into the same block generates a comparison data bit in response to the multi-bit input/output enable signal, and transfers the comparison data to the multi-bit input/output pin.

BRIEF DESCRIPTION OF THE DRAWINGS

The above and other objects, features and advantages of the present invention will become more apparent in the light of the following detailed description of an exemplary embodiment thereof taken with the accompanying drawings in which.

DETAILED DESCRIPTION OF THE PREFERRED EMBODIMENT

A multi-bit test circuit according to an embodiment of the present invention will be described in detail hereinbelow with reference to the attached drawings, in which like numerals represent like elements.

Figure 1:
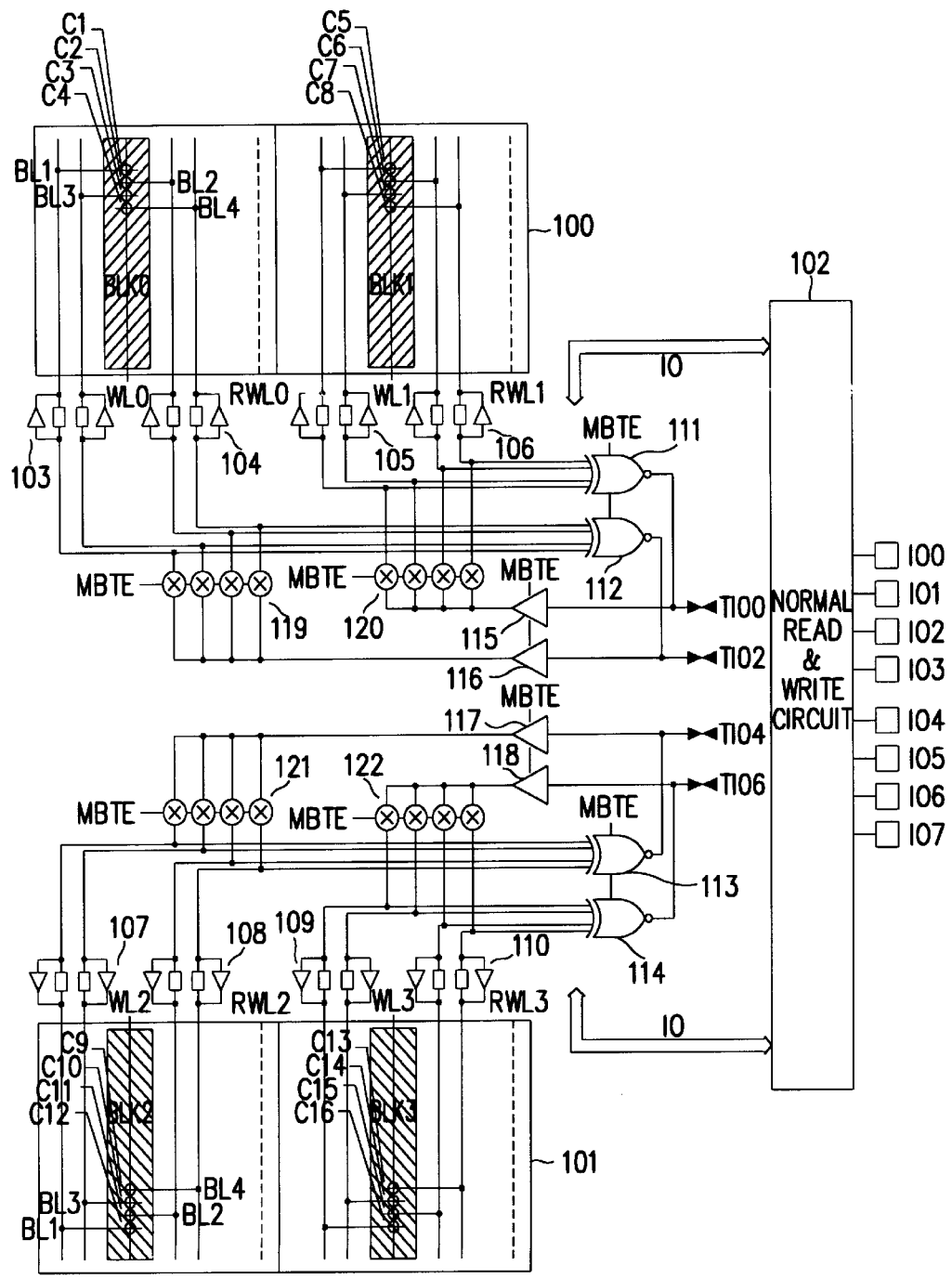
FIG. 1 is a circuit diagram showing a multi-bit test circuit according to the prior art.
Figure 2:
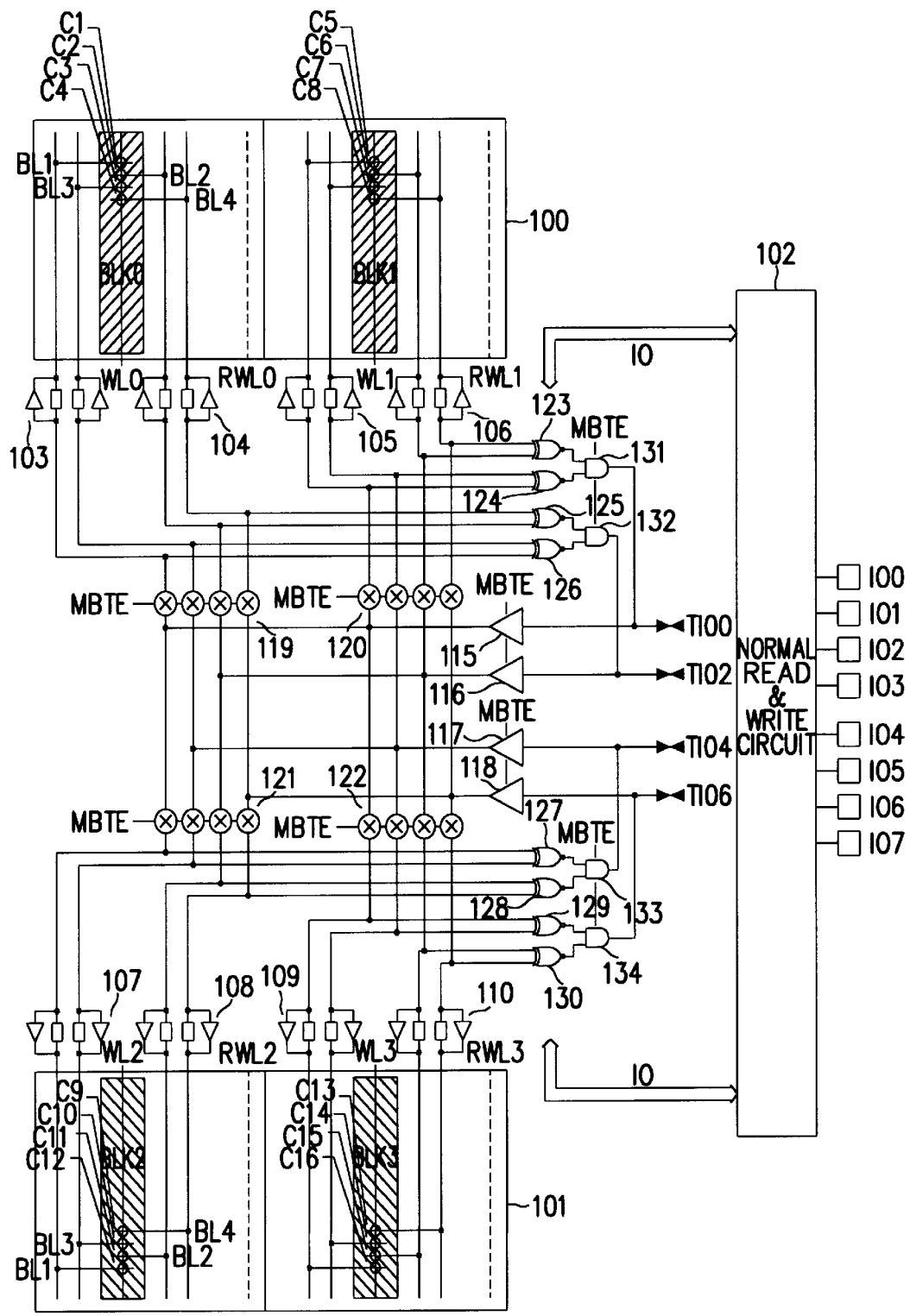
FIG. 2 is a circuit diagram showing a multi-bit test circuit according to a preferred embodiment of the present invention.

FIG. 2 is a circuit diagram showing a multi-bit test circuit according to a preferred embodiment of the present invention, in which separate circuits related to the multi-bit testing are incorporated to bring a better understanding of the present invention. It is well known that the normal read/write mode is switched to the multi-bit test mode in synchronism with a write enable signal and a CAS-before-RAS clock WCBR. Further, the multi-bit test mode of operation is completed in response to the CAS-before-RAS or a RAS-only-refresh cycle. As illustrated, the multi-bit test circuit according to the present invention includes a memory cell array divided into sub-arrays 100 and 101, sense amplifier drivers 103–110, input buffers 115–118, comparators 123–134, switching circuits 119–122 which are switched in response to the multi-bit test enable signal MBTE, and multi-bit input/output pins TIO0, TIO2, TIO4 and TIO6. The above mentioned circuit elements excepting the comparators 123–134 have the same structures as those of the prior art multi-bit test circuit shown in FIG. 1, so that the detailed descriptions thereof will be omitted to avoid duplication.

As illustrated in FIG. 2, the input buffers 115–118 are connected to the sense amplifier drivers 103–110 via the switching circuits 119–122, respectively. The sense amplifier drivers 103–110 are connected to the corresponding bit lines BL1–BL4, respectively. The sub-array 100 includes blocks BLK0 and BLK1 and redundant word lines RWL0 and RWL1 for replacing the fail word lines. Similarly, the sub-array 101 includes blocks BLK2 and BLK3 and redundant word lines RWL2 and RWL3 for replacing the fail word lines. Memory cells C1–C16 are formed at the intersections of the bit lines BL1–BL4 and the word lines WL0–WL3. The semiconductor memory device switches over the operation modes from the normal read/write mode to the multi-bit test mode in response to the multi-bit test enable signal MBTE. The input buffers 115–118 transfer the test data bits on the multi-bit input/output pins TIO0, TIO2, TIO4, and TIO6 to the sense amplifier drivers 103–110 via the switching circuits 119–122, in response to the multi-bit test enable signal MBTE. The sense amplifier drivers 103–110 amplify test data bits and simultaneously transfer the amplified test data bits to the memory cells in the memory blocks BLK0–BLK3. Here, the memory cells C1–C4, C5–C8, C9–C12, and C13–C16 in the respective blocks BLK0–BLK3 are connected in series to the word lines WL0–WL3, respectively. For example, the test data bit of the first logic state from the multi-bit input/output pin TIO0 is simultaneously stored into the memory cells C1, C5, C12, and C16 in the respective blocks BLK0–BLK3, and the test data bit of the second logic state from the multi-bit input/output pin TIO2 is simultaneously stored into the memory cells C2, C6, C11, and C15. In the same manner, the test data bits from the multi-bit input/output pins TIO4 and TIO6 are stored into the memory cells (C3, C7, C10 and C14) and (C4, C8, C9 and C13), respectively. Therefore, the memory cells C1 and C2 adjacent to each other store the test data bits of different phases, respectively. Namely, the contiguous memory cells connected to the same word line store the test data bits of different phases, unlike the prior art multi-bit test circuit in which the contiguous memory cells store the same test data bits.

In this way, it is possible to accurately generate the fail information even if there exists a short bridge between the bit lines or the memory cells. Now, an operation of the multi-bit test circuit according to the present invention will be described in detail hereinbelow. As described above, the test data bits received from the different multi-bit input/output pins, stored into four contiguous memory cells in the same block, are compared with one another to generate a comparison data bit. The comparison data bit is transferred to the corresponding multi-bit input/output pin. Exclusive NOR 125 and 126 constituting the comparator independently compare the test data bits stored into the contiguous memory cells C1–C4. Each of the comparators comprise two exclusive NOR gates and an AND gate. The AND gates 131–134 transfer the comparison data bits from the pairs of exclusive NOR gates 123–130 to the corresponding multi-bit input/output pins, in response to the multi-bit test enable signal MBTE. If the memory cells C1 and C3 store the data bits of the same phase and the memory cells C2 and C4 store the data bits of the same phase, the comparator comprised of the gates 125, 126 and 132 will generate the comparison data "1" at the multi-bit input/output pin TIO2. However, if any one of the four memory cells C1–C4 is the fail cell, the comparator will generate the comparison data "0" at the multi-bit input/output pin TIO0. In this case, although it is uncertain which memory cell is the fail cell, it is possible to replace the fail word line WL0 with the redundant word line RWL0. Similarly, it can be checked whether or not the word lines WL1–WL3 are defective by means of the multi-bit input/output pins TIO0, TIO4, and TIO6, respectively.

As described in the foregoing, the multi-bit test circuit according to the present invention includes the multi-bit input/output pins of which input path and output path are separated, to form an effective test pattern. Thus, it is possible to detect the fail bit information accurately. Further, the contiguous memory cells connected to the same word line store test data bits of different phases. The comparators compare the test data bits of the same phase to each other, so that fail bits due to a short bridge can be accurately detected.

Although a preferred embodiment of the present invention has been described in detail hereinabove, it should be clearly understood that many variations and/or modifications of the basic inventive concepts herein taught which may appear to those skilled in the art will still fall within the spirit and scope of the present invention as defined in the appended claims.

What is claimed is:

1. A method for testing a plurality of memory cells simultaneously to generate fail bit information, in a semiconductor memory device including a memory cell array divided into a plurality of sub-arrays each being divided again into a plurality of blocks by a word line, said each block including a plurality of the memory cells connected respectively at intersections of a plurality of bit lines and one word line, the method comprising the steps of:

simultaneously storing test data bits received from a plurality of multibit input/output pins into the memory cells, a test data bit of the same logic state received from one of the multibit input/output pins being stored into selected ones of the memory cells in each block simultaneously;

comparing the data bits stored into a same block with one another, to generate a comparison data bit; and transferring said comparison data bit to said multibit input/output pins.

2. A method for testing a plurality of memory cells according to claim 1, wherein said test data bits stored into contiguous memory cells in the same block have complementary voltage levels alternately.

3. A method for testing a plurality of memory cells according to claim 1, wherein the test data bits stored into the same block are compared at a corresponding comparator, wherein said comparator includes a plurality of exclusive NOR gates and an AND gate is enabled in response to a multibit test enable signal.

4. A method for testing a plurality of memory cells according to claim 1, wherein said memory cells in the same block are connected contiguously to the word line, wherein the contiguous memory cells store the test data bits received from the different multi-bit input/output pins.

5. A method for testing a plurality of memory cells according to claim 1, wherein one of said two contiguous memory cells in the same block stores the test data bit of a first logic state, while the other memory cell stores the test data bit of a second logic state.

6. A method for testing a plurality of memory cells, comprising the steps of:

activating a plurality of blocks each including memory cells connected to bit lines and word lines;

storing a same data bit into selected ones of the memory cells in the respective blocks via a multi-bit input/output pin, memory cells contiguous to one another in the same block storing complementary data bits; and comparing the same data bits stored into the same block to generate fail bit information at said multi-bit input/output pin.

7. A circuit for testing a plurality of memory cells to generate fail information of a plurality of blocks each including the memory cells connected to bit lines and word lines, comprising:

an input buffer for transferring a test data bit of the same logic state received from a multibit input/output pin to only some of the memory cells in each block simultaneously in response to a multibit test enable signal;

a plurality of sense amplifier drivers connected to the respective memory cells, for amplifying the test data bits to transfer the amplified data bits to the associated memory cells, and reading out the test data bits stored into the associated memory cells; and a comparator for comparing the same data bits stored into the same block to generate a comparison data bit in response to said multibit input/output enable signal, and transferring the comparison data to said multibit input/output pin.

8. A circuit for testing a plurality of memory cells according to claim 7, wherein said comparator comprises an AND gate and a plurality of exclusive NOR gates each being connected to the bit lines via the sense amplifier drivers.

9. A circuit for testing a plurality of memory cells according to claim 7, wherein a number of the multi-bit input/output pins connected to one block is less than a number of the memory cells in one block.

10. A circuit for testing a plurality of memory cells according to claim 7, wherein said test data bits have different input and output paths.

11. A circuit for testing a plurality of memory cells according to claim 7, wherein said memory cells in the same block are connected contiguously to the word line, wherein the contiguous memory cells store the data bits received from the different multi-bit input/output pins.

12. A circuit for testing a plurality of memory cells according to claim 7, wherein one of said two contiguous memory cells in the same block stores the test data bit of a first logic state, while the other memory cell stores the test data bit of a second logic state.

13. A method for testing a plurality of memory cells simultaneously to generate fail bit information, in a semiconductor memory device including a memory cell array divided into a plurality of sub-arrays each being divided again into a plurality of blocks by a word line, said each block including a plurality of the memory cells connected respectively at intersections of a plurality of bit lines and one word line, the method comprising the steps of:

simultaneously storing test data bits received from a plurality of multibit input/output pins into the memory cells, a test data bit of the same logic state received from one of the multibit input/output pins being stored into selected ones of the memory cells in each block simultaneously, wherein said test data bits stored into contiguous memory cells in the same block have complementary voltage levels alternately;

comparing the data bits stored into a same block with one another, to generate a comparison data bit; and transferring said comparison data bit to said multibit input/output pins.

14. A method for testing a plurality of memory cells simultaneously to generate fail bit information, in a semiconductor memory device including a memory cell array divided into a plurality of sub-arrays each being divided again into a plurality of blocks by a word line, said each block including a plurality of the memory cells connected respectively at intersections of a plurality of bit lines and one word line, the method comprising the steps of:

simultaneously storing test data bits received from a plurality of multibit input/output pins into the memory cells, a same data bit received from one of the multibit input/output pins being stored simultaneously into selected ones of the memory cells in each block, wherein one of said two contiguous memory cells in the same block stores the test data bit of a first logic state, while the other memory cell stores the test data bit of a second logic state;

comparing the data bits stored into a same block with one another, to generate a comparison data bit; and transferring said comparison data bit to said multibit input/output pins.

15. A circuit for testing a plurality of memory cells to generate fail information of a plurality of blocks each including the memory cells connected to bit lines and word lines, comprising:

an input buffer for transferring a same test data bit received from a multibit input/output pin to selected ones of the memory cells in each block in response to a multibit test enable signal, wherein one of said two contiguous memory cells in the same block stores the test data bit of a first logic state, while the other memory cell stores the test data bit of a second logic state;

a plurality of sense amplifier drivers connected to the respective memory cells, for amplifying the test data bits to transfer the amplified data bits to the associated memory cells, and reading out the test data bits stored into the associated memory cells; and a comparator for comparing the same data bits stored into the same block to generate a comparison data bit in response to said multibit input/output enable signal, and transferring the comparison data to said multibit input/output pin.

* * * * *

UNITED STATES PATENT AND TRADEMARK OFFICE
CERTIFICATE OF CORRECTION

PATENT NO.   : 6,058,495
DATED        : May 2, 2000
INVENTOR(S)  : Lee et al.

It is certified that error appears in the above-identified patent and that said Letters Patent is hereby corrected as shown below:

Column 1,
Line 54, "LK3" should read -- BLK3 --;

Column 5,
Line 65, "into the same block" should read -- into memory cells of the same block --.

Signed and Sealed this

Twenty-ninth Day of October, 2002

*Attest:*

*Attesting Officer*

JAMES E. ROGAN
*Director of the United States Patent and Trademark Office*